(12) United States Patent
Rudin

(10) Patent No.: US 8,519,453 B2
(45) Date of Patent: Aug. 27, 2013

(54) THIN FILM TRANSISTOR DEVICE WITH METALLIC ELECTRODES

(75) Inventor: John Christopher Rudin, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 1681 days.

(21) Appl. No.: 10/563,679

(22) PCT Filed: Jul. 9, 2004

(86) PCT No.: PCT/GB2004/003016
§ 371 (c)(1),
(2), (4) Date: Jun. 9, 2006

(87) PCT Pub. No.: WO2005/008744
PCT Pub. Date: Jan. 27, 2005

(65) Prior Publication Data
US 2007/0052019 A1  Mar. 8, 2007

(30) Foreign Application Priority Data
Jul. 12, 2003  (GB) .................................. 0316395.3

(51) Int. Cl.
*H01L 29/76* (2006.01)
*H01L 21/02* (2006.01)
*H01L 23/62* (2006.01)
*H01L 29/786* (2006.01)
*H01L 29/49* (2006.01)
*H01L 29/417* (2006.01)
*H01L 31/0392* (2006.01)

(52) U.S. Cl.
USPC .................. 257/288; 257/359; 257/E29.275; 257/E29.151; 257/E29.276; 257/E29.299; 257/E29.273; 257/E29.117; 257/E31.041

(58) Field of Classification Search
USPC ............. 257/E29.275, E29.151, 40, E29.276, 257/E29.299, E29.273, E29.117, 289, 359, 257/E31.041; 438/149, 151, 99
See application file for complete search history.

(56) References Cited

U.S. PATENT DOCUMENTS

| | | | |
|---|---|---|---|
| 5,183,780 A * | 2/1993 | Noguchi et al. | 438/151 |
| 5,243,213 A | 9/1993 | Miyazawa et al. | |
| 5,388,328 A | 2/1995 | Yokono et al. | |
| 6,326,640 B1 * | 12/2001 | Shi et al. | 257/40 |
| 6,555,411 B1 | 4/2003 | Bao et al. | |
| 6,620,657 B2 | 9/2003 | Breen et al. | |

(Continued)

FOREIGN PATENT DOCUMENTS

| JP | 63299297 | 6/1988 |
|---|---|---|
| JP | 4199638 A | 7/1992 |

(Continued)

*Primary Examiner* — Phat X Cao
*Assistant Examiner* — Diana C Vieira

(57) ABSTRACT

A transistor device having a metallic source electrode, a metallic drain electrode, a metallic gate electrode and a channel in a deposited semiconductor material, the transistor device comprising: a first layer comprising the metallic gate electrode, a first metal portion of the metallic source electrode and a first metal portion of the metallic drain electrode; a second layer comprising a second metal portion of the metallic source electrode, a second metal portion of the metallic drain electrode, the deposited semiconductor material and dielectric material between the semiconductor material and the metallic gate electrode; and a third layer comprising a substrate, wherein the first, second and third layers are arranged in order such that the second layer is positioned between the first layer and the third layer.

12 Claims, 2 Drawing Sheets

(56) References Cited

U.S. PATENT DOCUMENTS

| | | |
|---|---|---|
| 2002/0000614 A1 | 1/2002 | Chen et al. |
| 2002/0008464 A1 | 1/2002 | Christensen |
| 2002/0093017 A1 | 7/2002 | Andry et al. |
| 2002/0146893 A1 | 10/2002 | Shimoda et al. |
| 2002/0172877 A1 | 11/2002 | Inagaki et al. |
| 2002/0172887 A1 | 11/2002 | Wolk et al. |
| 2003/0211665 A1 | 11/2003 | Bao et al. |

FOREIGN PATENT DOCUMENTS

| | | |
|---|---|---|
| WO | WO 01/95384 A1 | 12/2001 |
| WO | WO 02/065557 A1 | 8/2002 |
| WO | WO 03/010837 A | 2/2003 |

\* cited by examiner

THIN FILM TRANSISTOR DEVICE WITH METALLIC ELECTRODES

FIELD OF THE INVENTION

Embodiments of the invention relate to transistor devices with metallic electrodes and methods for forming such devices. Some embodiments relate to thin film transistor (TFT) devices that are suitable for integration in large area substrates at low cost.

BACKGROUND TO THE INVENTION

JP63299296 (Meiko), JP63299297A (Meiko) and "Manufacturing of Printed Wiring Boards by Ultra-high Speed Electroforming" by Norio Kawachi (Meiko) et al, Printed Circuit World Convention, June 1990 describe the use of the electroforming technique in creating circuit boards (printed wiring boards). Electroforming is an additive process that involves obtaining a replica (negative) of a metal carrier by electrolytic deposition of a metallic film using the carrier as a cathode. A patterned photo-resist is used to limit the electro-deposition of material to the exposed areas of the cathode. The documents additionally teach a transfer lamination process in which the deposited metal and photo-resist are laminated to a substrate and the master is removed leaving a deposited metal photo-resist substrate combination. JP63299296 (Meiko), JP63299297A (Meiko) additionally disclose the electrolytic deposition of a copper plate layer on the master before the deposition of the metal. This copper layer is transferred in the transfer-lamination process and is removed by etching.

U.S. Pat. No. 6,284,072 discloses the formation of patterning on a conductive carrier by micro-moulding. An insulating material is embossed to create a pattern that limits the electro-deposition of metal to exposed areas of the conductive carrier.

Electroforming is used in the semiconductor industry in the creation of printed wiring boards and large scale interconnects on bulk semiconductors. Electroforming is not accurate enough for use in bulk semiconductor device processing which is at a scale of nanometres.

The bulk semiconductor industry typically uses metal sputtering with UV photo-lithography to define small scale metal interconnects.

Organic semiconductors are a fairly recent development compared with bulk semiconductors. Devices made from organic semiconductors cannot match the speed or efficiencies of bulk semiconductors, but they have other distinct advantages. They are suitable for large area processing and can be used on flexible substrates. They have therefore attracted a lot of attention for their potential application in display device technologies, particularly their use in thin film transistors for use in active matrix displays.

An organic transistor typically has metallic source, gate and drain electrodes. A thin film of organic semiconductor forms a channel interconnecting the source and drain electrodes, that is separated from the gate electrode by a thin dielectric layer.

As years of research into the creation of bulk semiconductors have been carried out, the organic transistors presently re-use technology developed for bulk semiconductors as these processes are well understood. For example, the metallic electrodes are typically created by metal sputtering.

The inventors have realised that the use of sputtering may be optimal for bulk semiconductors but is sub-optimal for low cost, large area integrated circuits, such as displays incorporating organic thin film transistors.

Sputtering requires a vacuum environment. This is expensive and difficult to implement for large area processes.

Also, to obtain low impedance interconnects using sputtering the interconnects must either be wide or thick. A thick interconnect can create stresses which require controlling, which adds cost. Thick interconnects may limit the resolution of the devices (the number per unit area).

U.S. Pat. No. 6,344,662 describes the creation of a TFT having a hybrid organic-inorganic semiconductor layer. The gate metallization is formed using electron beam evaporation and the metal source and drain are formed separately by vapor deposition. Claim 6 states, without further explanation or clarification, that the gate electrode is produced by a process selected from the group consisting of evaporation, sputtering, chemical vapor deposition, electrodeposition, spin coating, and electroless plating.

BRIEF DESCRIPTION OF THE INVENTION

It would therefore be desirable to provide an improved method for creating a semiconductor device suitable for integration in large area substrates at low cost.

Some embodiments of the invention provide a transistor device having a metallic source electrode, a metallic drain electrode, a metallic gate electrode and a channel in a deposited semiconductor material, the transistor device comprising: a first layer comprising the metallic gate electrode, a first metal portion of the metallic source electrode and a first metal portion of the metallic drain electrode; a second layer comprising a second metal portion of the metallic source electrode, a second metal portion of the metallic drain electrode, the deposited semiconductor material and dielectric material between the semiconductor material and the metallic gate electrode; and a third layer comprising a substrate, wherein the first, second and third layers are arranged in order such that the second layer is positioned between the first layer and the third layer.

Some embodiments of the invention provide a method for use in forming a transistor device comprising:
(i) forming a transfer layer on a conductive carrier;
(ii) fixing the transfer layer to a substrate; and
(iii) removing the conductive carrier, wherein the transfer layer is formed in step (i) by:
   a) selectively masking the conductive carrier, to expose first, second and third portions of the conductive carrier;
   b) electro-depositing metal onto the first, second and third portions of the conductive carrier to form first, second and third metal portions;
   c) depositing dielectric material over at least the second metal portion;
   d) electro depositing metal on the first and third metal portions; and
   e) depositing semiconductor material over the dielectric layer.

Some embodiments of the invention provide a method for use in forming a transistor device having a metallic source electrode, a metallic drain electrode, a metallic gate electrode and a channel in a deposited semiconductor material, the transistor device comprising: a first upper planar layer comprising the metallic gate electrode, a first metal portion of the metallic source electrode and a first metal portion of the metallic drain electrode; a second middle planar layer comprising a second metal portion of the metallic source electrode, a second metal portion of the metallic drain electrode, the deposited semiconductor material and dielectric material between the semiconductor material and the metallic gate electrode; and a third lower planar layer comprising a substrate, wherein first, second and third planar layers are arranged in order such that the second middle layer is positioned between the first upper layer and the third lower layer, wherein the metallic source electrode, drain electrode and gate electrode comprise electro-deposited metal, the gate electrode occupies only the first upper planar layer and the channel occupies only the second middle planar layer, the metallic source electrode consists of the first metal portion of the metallic source electrode overlying the second metal portion of the metallic source electrode and the metallic drain electrode consists of the first metal portion of the metallic drain electrode overlying the second metal portion of the metallic drain electrode.

The terms electro-deposition and electrolytic deposition are synonymous.

BRIEF DESCRIPTION OF THE DRAWINGS

For a better understanding of the invention and to understand how it may be brought into effect reference will now be made to the accompanying drawings of example embodiments of the invention in which.

DETAILED DESCRIPTION OF EMBODIMENTS OF THE INVENTION

FIGS. 1A to 1H schematically illustrate the stages during an additive method for forming a layered thin film transistor (TFT) device 340 using electrolytic deposition and transfer lamination. The figures are not to scale.

Figure 1A:
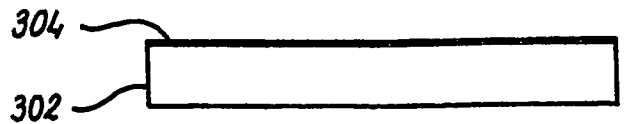
FIGS. 1A to 1H illustrate stages in forming a transistor device 340.

FIG. 1A illustrates a passivated substantially planar conductive carrier 302. This may be a platen or a sheet of material in a roll to roll process. The passivated substantially planar conductive carrier 302 includes a passivation layer 304 this may for example include a very thin oxide and/or a surfactant.

Figure 1B:
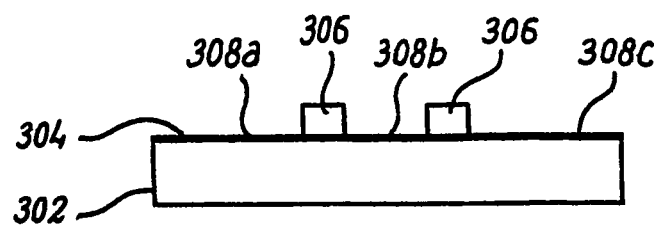
Figure 1C:
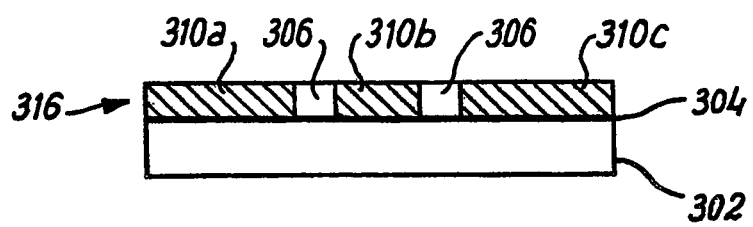

FIGS. 1B and 1C illustrate the formation of a first layer 316 of the transistor device on the conductive carrier 302. In FIG. 1B insulating material 306 is selectively formed on the passivated conductive carrier 302 by a selective additive process or a selective subtractive process. In a selective subtractive process, insulating material is deposited over the whole of the passivated conductive carrier 302 as a substantially planar layer and selectively removed from first, second and third portions 308a, 308b and 308c of the passivated conductive carrier 302. In a selective additive process, insulating material is deposited only in the regions of the passivated conductive carrier 302 where required to form patterned structures 306. This may be achieved, for example, by embossing, micro-molding, photolithography or any other suitable alternative process. If photolithography is used, the insulating material 306 is preferably photo-patternable. It is selectively exposed to radiation through a mask or using a spot-laser and developed to expose the portions 308a, 308b and 308c of the conductive carrier 302. One suitable photo-patternable insulator is SU-8 by Micro-Chemical Corporation. This is a hard UV cure polymer, which is used at a thickness of between 1 and 5 µm.

The conductive carrier 302 is connected as a cathode and metal is deposited by electrolytic deposition on the first, second and third exposed portions 308a, 308b and 308c of the passivated conductive carrier 302 to form respective first, second and third metal portions 310a, 310b and 310c. The first metal portion 310a will eventually form part of the drain of the transistor device 340. The second metal portion 310b will eventually form the gate of the transistor device 340. The third metal portion 310c will eventually form part of the source of the transistor device 340.

The metal may be any metal that is capable of electrolytic deposition with good conductivity e.g. Ni, Cu, Ag, Au. It is typically deposited with a thickness of between 2 and 5 µm.

Figure 1D:
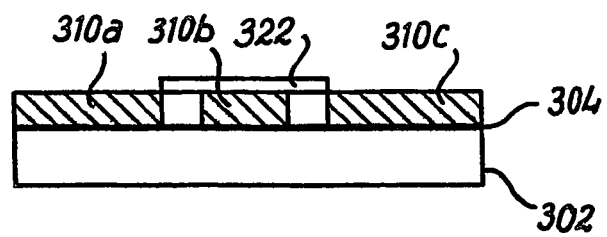

In FIG. 1D, dielectric material 322 is selectively formed. It covers the second metal portion 310b and overlaps the portions of the insulating layer 306 that separate the second metal portion 310b from the first metal portion 310a and from the third metal portion 310c. The dielectric material 322 may be formed from photo-patternable material, such as SU8, which is deposited over the whole of the first layer 316 and laser spot cured in the area where it is to remain. Development of the resist removes it to form the dielectric material 322 covering the second metal portion 310b. The overlap of the dielectric material 322 with the portions of the insulating layer 306, provides tolerance in the alignment of the laser.

The dielectric material 322 therefore covers the second metal portion 310b. This masks the second metal portion 310b from further electrolytic deposition. The dielectric material 322 forms the gate dielectric of the final transistor device 340. The dielectric layer typically has a thickness of the order 100-600 nm. The width of the dielectric layer exceeds the width of the second metal portion 310b of the transistor device 340, which is typically 1-5 µm.

Figure 1E:
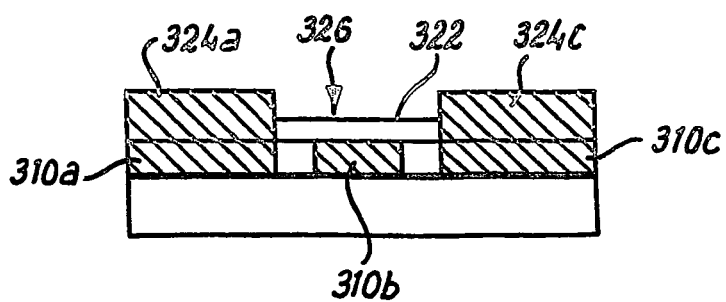

Anisotropic electrolytic deposition of metal is then carried out. As illustrated in FIG. 1E, a first further metal portion 324a is deposited on the first metal portion 310a and a second further metal portion 324c is deposited on the second metal portion 310c. The combination of the metal portions 310a and 324a forms the drain of the final transistor device 340 and the combination of the metal portions 310c and 324c forms the source of the final transistor device 340. A well or channel 326 is formed above the dielectric 322 and between the first and second further metal portions 324a and 324c. Brightening agents can be added to the electrolytic solution to control the isotropy/anisotropy of metal growth. This can be used to control the cross-sectional profile of the well or channel 326.

Figure 1F:
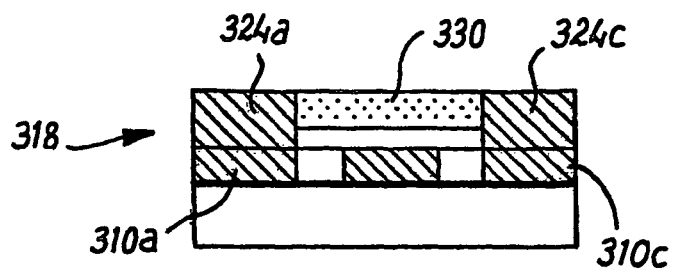

In FIG. 1F, semiconductor material 330 is deposited into the well or trench 326 to fill it. The semiconductor may, for example, be an organic semiconductor, a solution processable semiconductor, nano-particulate dispersion of semiconductor; conjugated polymers or oligomers in solution. The semiconductor may be deposited by spinning it on in liquid solvent form and evaporating the solvent. Alternatively micro-dispensing techniques such as piezo inkjet or thermal inkjet may be used to selectively fill the well or trench 326. Further laser, heat or radiation processes may be used to improve the semiconductor properties.

The semiconductor material 330 completes the second layer 318 of the transistor device 340. The second layer 318 includes the further first metal portion 324a, the further third metal portion 324c, the semiconductor material 330 and the dielectric 322. No etch-back or patterning is required to place the semiconductor material in the well or channel 326.

Figure 1G:
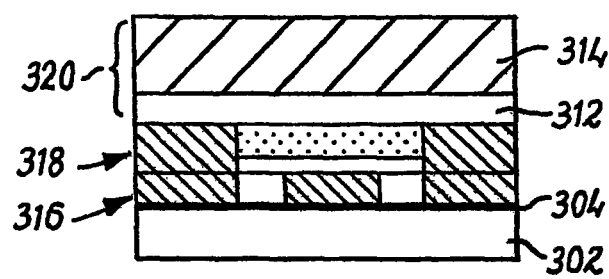

The first and second layers 316 and 318 form a transfer layer which is transferred to a passive substrate 314. The passive substrate 314 is adhered to the substantially planar upper surface of the second layer 318 using a layer of adhesive 312 as illustrated in FIG. 1G. This substrate will form the substrate of the final TFT 340. The substrate 314 may be made of glass. Alternatively, it may be a flexible plastic substrate, for example, made from PET. The adhesive used may be NOA81 by Norland Products Inc. The thickness of the substrate 314 is typically between 50 and 200 µm. The thickness of the adhesive layer 312 is typically between 5 and 20 µm.

Figure 1H:
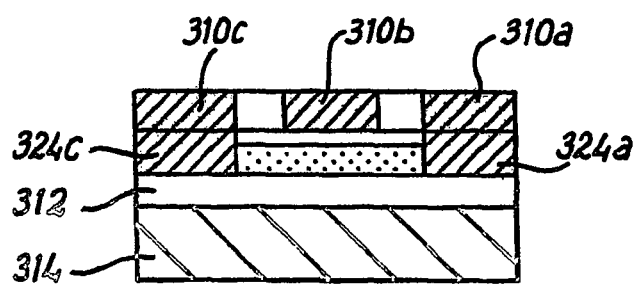

The adhesive layer 312 is cured using ultra-violet (UV) radiation or applied heat. The structure may then be shock-cooled and the passivated conductive carrier 302 is removed (peeled-off) to form the TFT device 340, as illustrated in FIG. 1H. In FIG. 1H, the structure has been inverted.

Figure 2:
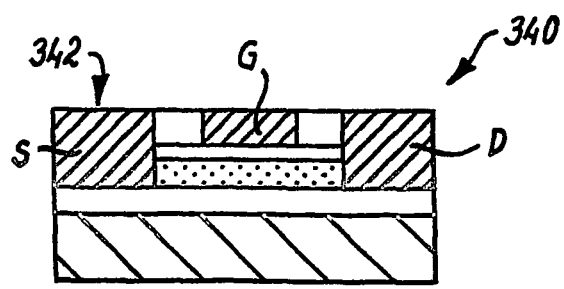
FIG. 2 illustrates the transistor device 340.

The final TFT device is illustrated in FIG. 2. It has a metallic source electrode S, a metallic drain electrode D and a metallic gate electrode G comprising: a first notional layer 316 including the metallic gate electrode G, a first portion 310c of the metallic source electrode S and a first portion 310a of the metallic drain electrode D; a second notional layer 318 including a second portion 324c of the metallic source electrode, a second portion 324a of the metallic drain electrode and deposited semiconductor material 330 overlying dielectric material 322; and a third layer 320 including a passive substrate 314 and adhesive 312. The join between the first layer 316 and the second layer 318 through the source S and drain D may be discernable. The metal portions 310a, 310b, 310c, 324a and 324c will generally contain artefacts of the electrolytic process by which they were formed. The TFT device 340 has an upper substantially planar surface 342 including the upper substantially planar surfaces of the first, second and third metal portions 210a, 210b and 210c.

The substrate 314 may be a large area flexible substrate (many square centimetres or metres) with thousands or millions of devices 340 integrated thereon.

It should be appreciated that the above-described method has a number of advantages. The method requires a small number of masks and the associated problem of their accurate alignment is limited. The use of electrolytic deposition of metal on the first and second metal portions to form the relief for receiving the semiconductor 330 is a self-aligning process. The above-described processes can be carried out at low temperature (room temp +/−100 degrees Celsius) and without vacuum processing. There may additionally be no need for further processing on the final substrate 314, which may be flexible plastic for example. The semiconductor material is encapsulated within the surface of the resulting device, rendering it robust and reducing susceptibility to any contamination/chemical attack from subsequent processing. The resulting upper surface of the device may be substantially planar which is also advantageous for further processing, particularly in display applications.

Although embodiments of the present invention have been described in the preceding paragraphs with reference to various examples, it should be appreciated that modifications to the examples given can be made without departing from the spirit and scope of the invention. For example, referring to FIGS. 1E and 1F, the electro-deposition of metal to form the further first and third metal portions 324a and 324c may occur before or after the deposition of semiconductor material 330.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. A transistor device having a metallic source electrode, a metallic drain electrode, a metallic gate electrode and a channel in a deposited semiconductor material, the transistor device comprising:
    a first layer comprising the metallic gate electrode, a first metal portion of the metallic source electrode and a first metal portion of the metallic drain electrode;
    a second layer comprising a second metal portion of the metallic source electrode, a second metal portion of the metallic drain electrode, the deposited semiconductor material and dielectric material between the semiconductor material and the metallic gate electrode; and
    a third layer comprising a substrate, wherein the first, second and third layers are arranged in order such that the second layer is positioned between the first layer and the third layer.

2. A transistor device as claimed in claim 1, wherein the metallic source electrode, drain electrode and gate electrode comprise electro-deposited metal.

3. A transistor device as claimed in claim 1, wherein the first, second and third layers are each of respective substantially uniform thickness.

4. A transistor device as claimed in claim 1, wherein the third layer includes adhesive bonding the substrate to the transistor device.

5. A transistor device as claimed in claim 1, wherein the first layer has a substantially planar surface comprising substantially planar portions of the source, drain and gate electrodes.

6. A transistor device as claimed in claim 1, wherein the deposited semiconductor material comprises organic semiconductor material.

7. A transistor device as claimed in claim 1, wherein the deposited semiconductor material comprises indications that it was deposited from liquid.

8. A transistor device as claimed in claim 1, wherein the semiconductor material is embedded in the device and overlain by the gate electrode.

9. A transistor device as claimed in claim 1 further comprising insulating material separating the gate electrode from the source electrode and the drain electrode.

10. A substrate for a display device comprising a plurality of transistor devices as claimed in claim 1.

11. A transistor device having a metallic source electrode, a metallic drain electrode, a metallic gate electrode and a channel in a deposited semiconductor material, the transistor device comprising:
    a first upper planar layer comprising the metallic gate electrode, a first metal portion of the metallic source electrode and a first metal portion of the metallic drain electrode;
    a second middle planar layer comprising a second metal portion of the metallic source electrode, a second metal portion of the metallic drain electrode, the deposited semiconductor material and dielectric material between the semiconductor material and the metallic gate electrode; and
    a third lower planar layer comprising a substrate, wherein first, second and third planar layers are arranged in order such that the second middle layer is positioned between the first upper layer and the third lower layer,
    wherein the metallic source electrode, drain electrode and gate electrode comprise electro-deposited metal, the gate electrode occupies only the first upper planar layer and the channel occupies only the second middle planar layer, the metallic source electrode consists of the first metal portion of the metallic source electrode overlying the second metal portion of the metallic source electrode and the metallic drain electrode consists of the first metal portion of the metallic drain electrode overlying the second metal portion of the metallic drain electrode.

12. A transistor device as claimed in claim 1, wherein the metallic source, gate and drain electrodes consist entirely of electro-deposited material and the metallic gate electrode contacts the dielectric material.

* * * * *